(12) United States Patent
Zhuang et al.

(10) Patent No.: US 10,394,985 B2
(45) Date of Patent: Aug. 27, 2019

(54) APPARATUS AND METHOD FOR MODELING RANDOM PROCESS USING REDUCED LENGTH LEAST-SQUARES AUTOREGRESSIVE PARAMETER ESTIMATION

(71) Applicant: Samsung Electronics Co., Ltd., Gyeonggi-do (KR)

(72) Inventors: Binnan Zhuang, San Diego, CA (US); Dongwoon Bai, San Diego, CA (US); Jungwon Lee, San Diego, CA (US)

(73) Assignee: Samsung Electronics Co., Ltd. (KR)

( * ) Notice: Subject to any disclaimer, the term of this patent is extended or adjusted under 35 U.S.C. 154(b) by 164 days.

(21) Appl. No.: 15/465,181

(22) Filed: Mar. 21, 2017

(65) Prior Publication Data
US 2018/0196906 A1 Jul. 12, 2018

Related U.S. Application Data (60) Provisional application No. 62/445,054, filed on Jan. 11, 2017.

(51) Int. Cl.
*G06F 17/50* (2006.01)
(52) U.S. Cl.
CPC ...... *G06F 17/5036* (2013.01); *G06F 17/5072* (2013.01); *G06F 17/5081* (2013.01)
(58) Field of Classification Search
CPC . G06F 17/5036; G06F 17/504; G06F 17/5072
(Continued)

(56) References Cited

U.S. PATENT DOCUMENTS

| 5,581,580 A | 12/1996 | Lindbom et al. |
| 6,580,772 B2 | 6/2003 | Pajukoski |

(Continued)

FOREIGN PATENT DOCUMENTS

| CN | 103326966 | 9/2013 |
| DE | 4028322 | 3/1992 |

(Continued)

OTHER PUBLICATIONS

Peiling, Zhang et al., Channel estimation in OFDM power line communication based on pilots and particle filtering, Copyright 2016 IEEE, pp. 6941-6946.

(Continued)

*Primary Examiner* — Suchin Parihar
(74) *Attorney, Agent, or Firm* — The Farrell Law Firm, P.C.

(57) ABSTRACT

An apparatus and method for modelling a random process using reduced length least-squares autoregressive parameter estimation is herein disclosed. The apparatus includes an autocorrelation processor, configured to generate or estimate autocorrelations of length m for a stochastic process, where m is an integer; and a least-squares (LS) estimation processor connected to the autocorrelation processor and configured to model the stochastic process by estimating $p^{th}$ order autoregressive (AR) parameters using LS regression, where p is an integer much less than m. The method includes generating, by an autocorrelation processor, autocorrelations of length m for a stochastic process, where m is an integer; and modelling the stochastic process, by a least-squares estimation processor, by estimating $p^{th}$ order autoregressive (AR) parameters by least-squares (LS) regression, where p is an integer much less than m.

20 Claims, 4 Drawing Sheets

(58) Field of Classification Search
USPC .......................................................... 716/52
See application file for complete search history.

(56) References Cited

U.S. PATENT DOCUMENTS

| | | | |
|---|---|---|---|
| 6,868,276 | B2 | 3/2005 | Nissila |
| 7,356,096 | B2 | 4/2008 | Reid |
| 7,573,965 | B2 | 8/2009 | Iancu et al. |
| 8,737,550 | B1 | 5/2014 | Jonsson et al. |
| 8,761,274 | B2 | 6/2014 | Lopez de Victoria |
| 9,107,105 | B2 | 8/2015 | Zhang |
| 2004/0102937 | A1 | 5/2004 | Ibrahim |
| 2005/0254027 | A1* | 11/2005 | Smith .................... G03B 27/68 355/52 |
| 2008/0127027 | A1* | 5/2008 | Gallatin .................... G03F 1/36 716/52 |
| 2008/0130674 | A1 | 6/2008 | Ahmed-Ouameur et al. |
| 2012/0300659 | A1 | 11/2012 | Heldari et al. |
| 2013/0262049 | A1* | 10/2013 | Zhang .................... G06Q 50/06 703/2 |
| 2014/0127836 | A1* | 5/2014 | Hsu ........................... G03F 1/00 438/14 |
| 2014/0354969 | A1* | 12/2014 | Elings ................. G03F 7/70508 355/67 |
| 2015/0010170 | A1 | 1/2015 | Lindahl et al. |

FOREIGN PATENT DOCUMENTS

| | | |
|---|---|---|
| EP | 2337287 | 6/2011 |
| KR | 100874008 | 12/2008 |
| WO | WO 2007112749 | 10/2007 |

OTHER PUBLICATIONS

Chen, Baohao et al., A Novel Channel Estimation Method Based on Kalman Filter Compressed Sensing for Time-Varying OFDM System.
2014 Sixth International Conference on Wireless Communications and Signal Processing (WCSP), Copyright 2014 IEEE, pp. 5.

* cited by examiner

APPARATUS AND METHOD FOR MODELING RANDOM PROCESS USING REDUCED LENGTH LEAST-SQUARES AUTOREGRESSIVE PARAMETER ESTIMATION

PRIORITY

This application claims priority under 35 U.S.C. § 119(e) to a U.S. Provisional Patent Application filed on Jan. 11, 2017 in the United States Patent and Trademark Office (USPTO) and assigned Ser. No. 62/445,054, the entire contents of which are incorporated herein by reference.

FIELD

The present disclosure relates generally to a system and a method for modeling a random process, and more particularly, to a system and a method for modeling a random process using reduced length least-squares (LS) autoregressive (AR) parameter estimation.

BACKGROUND

An AR model may be used during signal processing as a representation or model of a type of random or stochastic process to describe certain time-varying processes. The AR model specifies that an output variable depends linearly on its own previous values and on a stochastic term, thus the AR model is in the form of a stochastic difference equation.

For an auto-covariance or autocorrelation function of a random process, a typical method of obtaining AR parameters is by solving a Yule-Walker (YW) equation. Using this approach, an AR model with lag p can exactly reproduce a stochastic process with identical correlations up to length p, where p is an integer. A typical AR parameter estimation method can exactly match autocorrelations up to a length p assuming that a $p^{th}$ order AR model is used. Therefore, to model long correlations, a large p is required, which typically indicates increased complexity and inefficiency.

SUMMARY

According to one embodiment, an apparatus includes an autocorrelation processor, configured to generate or estimate autocorrelations of length m for a stochastic process, where m is an integer; and a least-squares estimation processor connected to the autocorrelation processor and configured to model the stochastic process by estimating $p^{th}$ order AR parameters using LS regression, where p is an integer much less than m.

According to one embodiment, a method includes generating or estimating, by an autocorrelation processor, autocorrelations of length m for a stochastic process, where m is an integer; and modelling the stochastic process, by a least-squares estimation processor, by estimating $p^{th}$ order AR parameters using LS regression, where p is an integer much less than m.

According to one embodiment, a method of manufacturing an apparatus includes forming the apparatus on a wafer or a package with at least one other apparatus, wherein the apparatus includes an autocorrelation processor and an LS estimation processor configured to model a stochastic process represented by autocorrelations of length m by estimating $p^{th}$ order autoregressive parameters using LS regression; and testing the apparatus, wherein testing the apparatus includes testing the apparatus using one or more electrical to optical converters, one or more optical splitters that split an optical signal into two or more optical signals, and one or more optical to electrical converters.

According to one embodiment, a method of constructing an integrated circuit includes generating a mask layout for a set of features for a layer of the integrated circuit, wherein the mask layout includes standard cell library macros for one or more circuit features that include an apparatus including an autocorrelation processor and an LS estimation processor configured to model a stochastic process represented by autocorrelations of length m by estimating $p^{th}$ order autoregressive parameters using LS regression, where p is an integer, and where p is much less than m; disregarding relative positions of the macros for compliance to layout design rules during the generation of the mask layout; checking the relative positions of the macros for compliance to layout design rules after generating the mask layout; upon detection of noncompliance with the layout design rules by any of the macros, modifying the mask layout by modifying each of the noncompliant macros to comply with the layout design rules; generating a mask according to the modified mask layout with the set of features for the layer of the integrated circuit; and manufacturing the integrated circuit layer according to the mask.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

One embodiment of the present disclosure concerns an apparatus and a method of modeling a random process using reduced length LS AR parameter estimation to fit longer correlations. One embodiment of the present disclosure concerns an apparatus and method of a Kalman filter using the AR model obtained from the reduced length LS AR parameter estimation. One embodiment of the present disclosure concerns an apparatus and method of estimating a channel using the Kalman filter based on the reduced length LS AR parameter estimation.

The present apparatus and method utilizes long correlations with reduced number of parameters for complexity reduction. The present apparatus and method provides an LS formulation to estimate AR parameters, when using a "short" AR process to fit "long" correlations. According to one embodiment, the present apparatus and method uses a $p^{th}$ order AR process to model a stochastic process with known autocorrelations. The present apparatus and method provides an LS estimation to model autocorrelations with a length much larger than p. The present apparatus and method may further apply the reduced length LS based AR parameters to realize a Kalman filter, and use the Kalman filter for channel estimation (CE) to improve CE qualities in slowly varying channels, according to one embodiment. The present apparatus and method may further use the AR process to derive other control methods, such as dynamic control. The present apparatus and method may apply the reduced length LS based AR parameter estimation to model any random process with long correlations.

Figure 1:
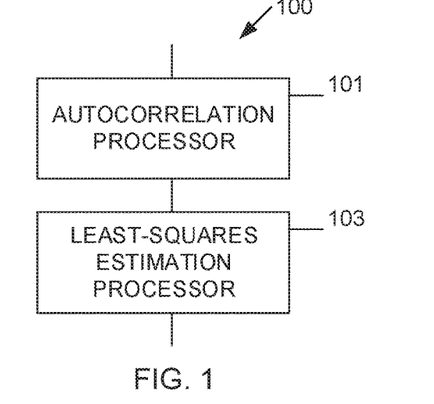
FIG. 1 illustrates an exemplary block diagram of an apparatus for modeling a random process, according to one embodiment.

FIG. 1 illustrates an exemplary block diagram of an apparatus for modeling a random process, according to one embodiment.

Referring to FIG. 1, the apparatus 100 includes an autocorrelation processor 101 and an LS estimation processor 103.

The autocorrelation processor 101 includes an input, and an output. The autocorrelation processor 101 is configured to receive data concerning a stochastic process, generate autocorrelations of length m for the stochastic process, where m is an integer, and output the autocorrelations.

The LS estimation processor 103 includes an input connected to the output of the autocorrelation processor 101, and an output. The LS estimation processor 103 is configured to model the stochastic process represented by the autocorrelations by estimating $p^{th}$ order AR parameters using LS regression, where p is an integer, and where p is much less than m.

Figure 2:
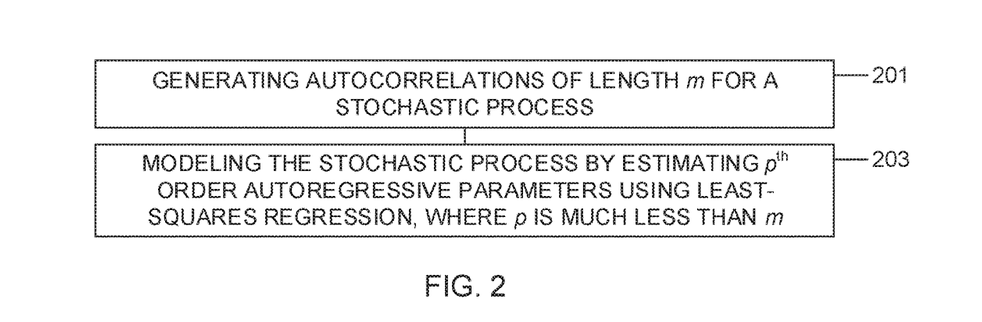
FIG. 2 illustrates an exemplary flowchart of a method of modeling a random process, according to one embodiment.

FIG. 2 illustrates an exemplary flowchart of a method of modeling a random process, according to one embodiment.

Referring to FIG. 2, autocorrelations of length m for a stochastic process are generated, by an autocorrelation processor, at 201, where m is an integer.

At 203, the stochastic process is modeled by estimating $p^{th}$ order AR parameters using LS regression, by an LS estimation processor, where p is an integer, and where p is much less than m.

Figure 3:
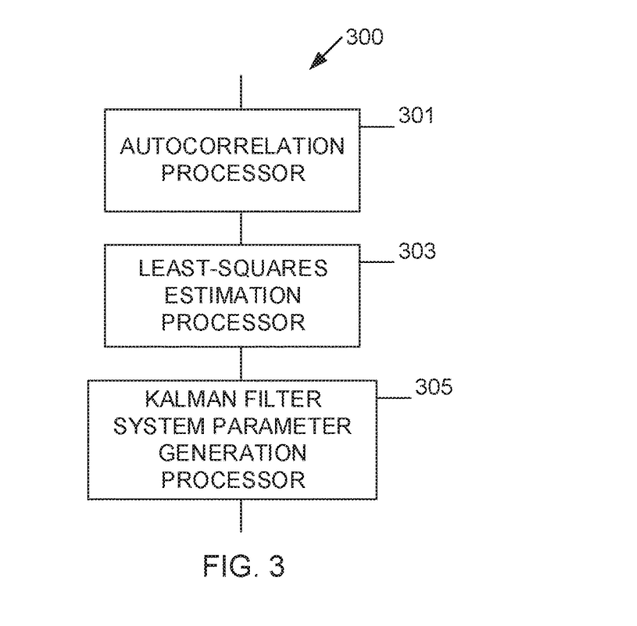
FIG. 3 illustrates an exemplary block diagram of a Kalman filter derived from estimated AR parameters, according to one embodiment.

FIG. 3 illustrates an exemplary block diagram of a Kalman filter derived from estimated AR parameters (e.g., generated based on the reduced length AR parameter estimations), according to one embodiment.

Referring to FIG. 3, the Kalman filter 300 includes an autocorrelation processor 301, an LS estimation processor 303, and a Kalman filter system parameter generation processor 305.

The autocorrelation processor 301 includes an input, and an output. The autocorrelation processor 301 is configured to receive data concerning a stochastic process, generate autocorrelations of length m for the stochastic process, where m is an integer, and output the autocorrelations.

The LS estimation processor 303 includes an input connected to the output of the autocorrelation processor 301, and an output. The LS estimation processor 303 is configured to model the stochastic process represented by the autocorrelations by estimating $p^{th}$ order AR parameters using LS regression, where p is an integer, and where p is much less than m.

The Kalman filter system parameter generation processor 305 includes an input connected to the output of the LS estimation processor 303, and an output. The Kalman filter system parameter generation processor 305 is configured to generate Kalman filter parameters using the $p^{th}$ order AR parameters estimated by the LS estimation processor 303.

Figure 4:
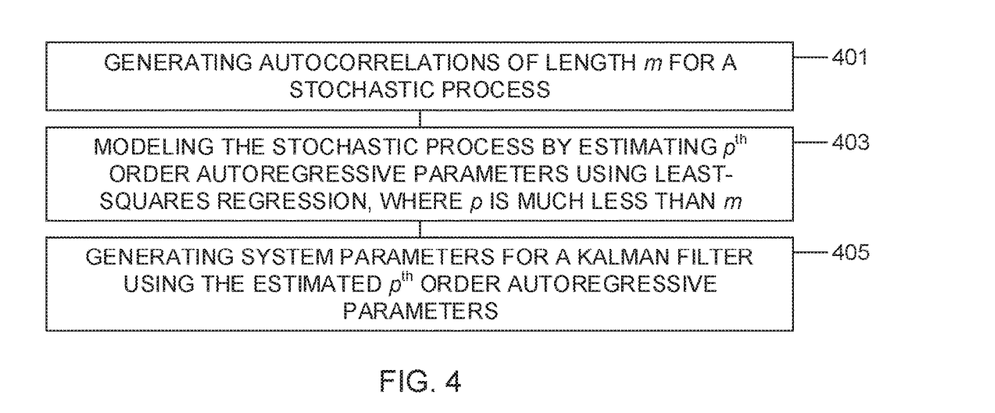
FIG. 4 illustrates an exemplary flowchart of a method of constructing a Kalman filter, according to one embodiment.

FIG. 4 illustrates an exemplary flowchart of a method of constructing a Kalman filter, according to one embodiment.

Referring to FIG. 4, autocorrelations of length m for a stochastic process are generated, by an autocorrelation processor, at 401, where m is an integer.

At 403, the stochastic process is modeled by estimating $p^{th}$ order AR parameters using LS regression, by an LS estimation processor, where p is an integer, and where p is much less than m.

At 405, Kalman filter parameters are generated, by a Kalman filter system parameter generation processor, using the estimated $p^{th}$ order AR parameters.

Figure 5:
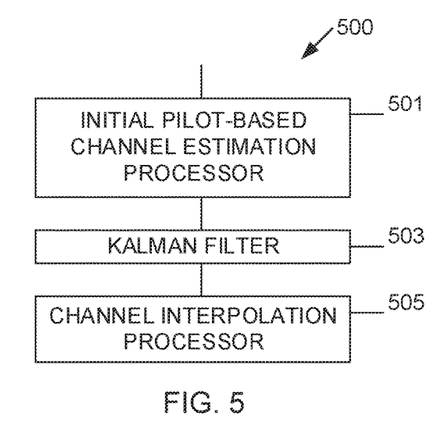
FIG. 5 illustrates an exemplary block diagram of an apparatus for channel estimation, according to one embodiment.

FIG. 5 illustrates an exemplary block diagram of an apparatus for channel estimation in an orthogonal frequency-division multiplexing (OFDM) based system, according to one embodiment.

Referring to FIG. 5, the apparatus 500 includes an initial pilot-based channel estimation processor 501, a Kalman filter 503, and a channel interpolation processor 505.

The initial pilot-based channel estimation processor 501 includes an input, and an output. The initial pilot-based channel estimation processor 501 is configured to extract a pilot signal of a channel. In one embodiment, the initial pilot-based channel estimation processor 501 includes a reference signal (RS) extraction processor that includes an input, and an output, and a descrambler that includes an input connected to the output of the RS extraction processor, and an output, where the descrambler is configured to descramble the extracted reference signal. The descrambled reference signal is used to obtain the initial channel estimation. The output of the initial pilot-based channel estimation processor 501 is an initial channel estimation at reference signal REs. The initial pilot-based channel estimation processor 501 receives a signal at a reference signal RE which may be expressed as $y_k = h_k s_k + n_k$, where $s_k$ is a reference signal, $h_k$ is a channel, and $n_k$ is noise. The initial pilot-based channel estimation processor 501, using reference signal extraction and descrambling, determines $s_k$. In one embodiment, an initial channel estimation is $\hat{h}_k = y_k / s_k$, which is output from the initial pilot-based estimation processor 501 and input to the Kalman filter 503 for further improvement.

The Kalman filter 503 includes an input connected to the output of the descrambler, and an output. The Kalman filter 503 is configured as described above with regard to FIG. 3 to process the initial channel estimation to provide improved channel estimation at reference signal resource elements (REs).

The channel interpolation processor 505 includes an input connected to the output of the Kalman filter 503, and an output. The channel interpolation processor 505 performs channel interpolation on the reference signal REs to provide channel estimation on the data REs, where an AR model is used to model a time domain correlation of the channel.

Figure 6:
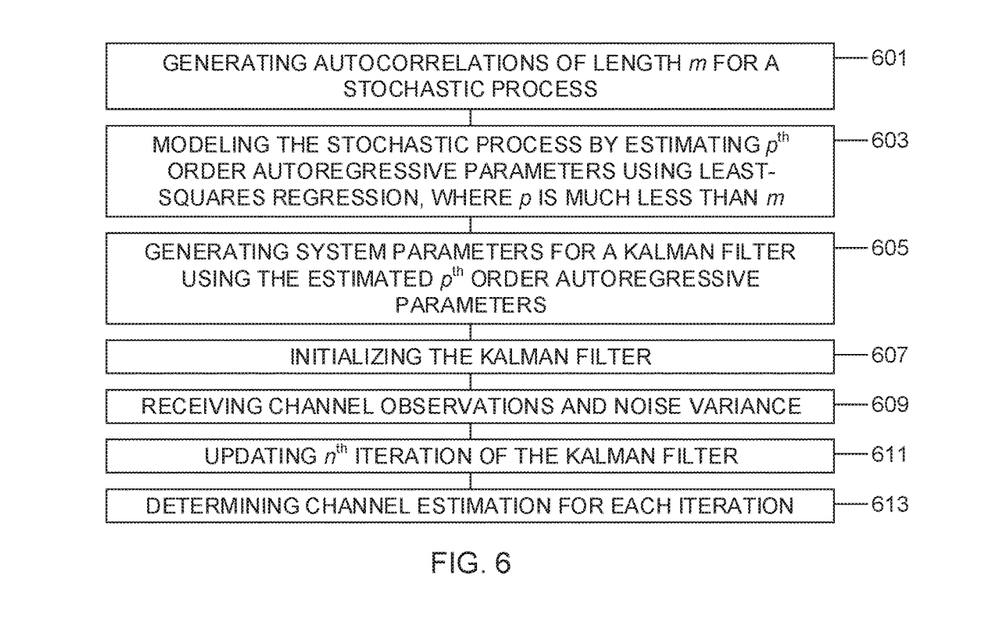
FIG. 6 illustrates an exemplary flowchart of a method of channel estimation, according to one embodiment.

FIG. 6 illustrates an exemplary flowchart of a method of channel estimation, according to one embodiment.

Referring to FIG. 6, autocorrelations of length m are generated or estimated, by an autocorrelation processor, for a stochastic process, where m is an integer, at 601.

At 603, the stochastic process is modeled by estimating, by an LS estimation processor, $p^{th}$ order AR parameters using LS regression, where p is an integer, and where p is much less than m.

At 605, system parameters for a Kalman filter are generated, by a Kalman filter system parameter generation processor, using the estimated $p^{th}$ order AR parameters, where the Kalman filter is as described above with regard to FIG. 3.

At 607, the Kalman filter is initialized.

At 609, channel observations and noise variance are received.

At 611, an $n^{th}$ iteration of the Kalman filter is updated, where n is an integer.

At 613, a channel estimation is determined for each iteration.

According to one embodiment, the present LS estimation apparatus and method sacrifices an exact match of the first p correlation values to achieve a better fitting to a much longer correlation distance in the square error sense. The present AR parameter estimation apparatus and method for Kalman filter based CE achieves significant performance gain and complexity reduction.

According to one embodiment, the present apparatus and method takes m known correlation values, where m>>p. The present apparatus and method estimates the p parameters of an AR model by solving an LS equation. The resulting AR model may closely model a correlation of a length much greater than p. In a communication system, such an AR model may be used to model time domain statistics of a slowly varying channel. Based on the known time domain correlations of a channel, a Kalman filter may be derived based on the AR model to estimate the channel. The CE quality may be significantly improved due to utilizing long time correlations.

The present apparatus and method provides reduced length LS AR parameter estimation that may efficiently characterize long correlations, which is very helpful for a practical implementation of different applications to utilize the long correlations with low complexity. The Kalman filter based CE approach is an example of such an application.

A pth order AR process with a vector state of size k, denoted by AR(p, k), may be expressed as in Equation (1) as follows:

$$h_n = \sum_{i=1}^{P} A_i H_{n-i} + B z_n, \quad (1)$$

where $h_n$ is a k×1 state variable in an nth time instance, p, n and k are integers, $A_i$ is a k×k matrix that is an AR parameter, $z_n$ is a k×1 vector that is a white Gaussian process with unit variance used to model the process noise, and B is a k×k matrix that is also an AR parameter.

A length n autocorrelation matrix may be denoted as $R_n = E\{h_{i+n} h_i^H\}$, where the corresponding stochastic process is wide-sense stationary. AR parameters may be obtained by solving the YW equation expressed in Equation (2) as follows:

$$\begin{bmatrix} A_1 \\ \vdots \\ A_p \end{bmatrix} = \begin{bmatrix} R_0 & \cdots & R_{p-1} \\ \vdots & \ddots & \vdots \\ R_{p-1} & \cdots & R_0 \end{bmatrix}^{-1} \begin{bmatrix} R_1 \\ \vdots \\ R_p \end{bmatrix}$$

$$BB^H = R_0 - [A_1, \ldots, A_p] \begin{bmatrix} R_0 & \cdots & R_{p-1} \\ \vdots & \ddots & \vdots \\ R_{p-1} & \cdots & R_0 \end{bmatrix} \begin{bmatrix} A_1 \\ \vdots \\ A_p \end{bmatrix} \quad (2)$$

An autocorrelation of the resulting AR process may be denoted as $\hat{R}_n$, n=0, ..., ∞. The autocorrelation values based on the YW AR parameter estimation exactly match the first p values of the true autocorrelation sequence as expressed in Equation (3) as follows:

$$\hat{R}_n = R_n, n=0, \ldots, p-1. \quad (3)$$

If more values in the given autocorrelation sequence are matched, p increases, where the complexity of subsequent applications also increases as p increases.

In order to use a small p to fit to long autocorrelations, an LS formulation may be used as expressed in Equation (4) as follows:

$$\min_{A_1,\ldots,A_p} \sum_{i=0}^{m-1} \|F_{A_1,\ldots,A_p}(i) - R_i\|_2 \qquad (4)$$

where $\hat{R}_n = F_{A_1,\ldots,A_p}(n)$ is an autocorrelation function determined by AR parameters, and $m \gg p$. In general, there is no closed form representation for $F_{A_1,\ldots,A_p}(n)$.

However, for a set of AR parameters $[A_1, \ldots, A_p]$, there exists a corresponding autocorrelation sequence $\hat{R}_n$, $n=1, \ldots, \infty$ for a process generated by the AR(p,k) model. This autocorrelation sequence satisfies the following property expressed in Equation (5):

$$\begin{bmatrix} \hat{R}_1 \\ \vdots \\ \hat{R}_m \end{bmatrix} = \begin{bmatrix} \hat{R}_0 & \cdots & \hat{R}_{p-1} \\ \vdots & \ddots & \vdots \\ \hat{R}_{m-1} & \cdots & \hat{R}_{m-p} \end{bmatrix} \begin{bmatrix} A_1 \\ \vdots \\ A_p \end{bmatrix}, \qquad (5)$$

for any positive integer m. By substituting an m×p autocorrelation matrix on the right hand side (RHS) of Equation (5) with a known autocorrelation matrix to be matched, an approximation may be obtained as expressed in Equation (6) as follows:

$$\begin{bmatrix} \hat{R}_1 \\ \vdots \\ \hat{R}_m \end{bmatrix} \approx \begin{bmatrix} R_0 & \cdots & R_{p-1} \\ \vdots & \ddots & \vdots \\ R_{m-1} & \cdots & R_{m-p} \end{bmatrix} \begin{bmatrix} A_1 \\ \vdots \\ A_p \end{bmatrix}. \qquad (6)$$

The first m autocorrelation values may be represented as a linear combination of the known autocorrelation values using the AR parameters to be estimated. Hence, the LS problem may be expressed as in Equation (7) as follows:

$$\min_{A_1,\ldots,A_p} \left\| \begin{bmatrix} R_0 & \cdots & R_{p-1} \\ \vdots & \ddots & \vdots \\ R_{m-1} & \cdots & R_{m-p} \end{bmatrix} \begin{bmatrix} A_1 \\ \vdots \\ A_p \end{bmatrix} - \begin{bmatrix} R_1 \\ \vdots \\ R_m \end{bmatrix} \right\|_2 \qquad (7)$$

The LS solution of Equation (7) above may be expressed as in Equation (8) as follows:

$$\begin{bmatrix} A_1 \\ \vdots \\ A_p \end{bmatrix} = \qquad (8)$$

$$\left[ \begin{bmatrix} R_0 & \cdots & R_{p-1} \\ \vdots & \ddots & \vdots \\ R_{m-1} & \cdots & R_{m-p} \end{bmatrix}^H \begin{bmatrix} R_0 & \cdots & R_{p-1} \\ \vdots & \ddots & \vdots \\ R_{m-1} & \cdots & R_{m-p} \end{bmatrix} \right]^{-1} \begin{bmatrix} R_0 & \cdots & R_{p-1} \\ \vdots & \ddots & \vdots \\ R_{m-1} & \cdots & R_{m-p} \end{bmatrix}^H$$

$$\begin{bmatrix} R_1 \\ \vdots \\ R_m \end{bmatrix}.$$

By selecting m>p, the fitting to a longer autocorrelation sequence may be improved. For example, a system may use an AR(4,1) process to model an autocorrelation of a slowly varying channel with a 5 Hz Doppler spread, where a true autocorrelation function may be given by a 0th order Bessel function. The autocorrelation generated using YW AR parameter estimation and the present LS AR parameter estimation with a different m, i.e., a different length of autocorrelations considered in the LS formulation may be compared. As m increases, fitting to the true autocorrelation function improves.

According to one embodiment, the present system and method applies estimated AR parameters using a Kalman filter for CE enhancement. A Kalman filter is an efficient way to utilize past channel observations and the corresponding time domain correlations. In each Kalman filter update, a prediction is included based on the system model as well as a correction based on an innovation from a new observation. However, a Kalman filter is susceptible to model mismatch. The reduced length LS AR parameter estimation can improve modeling precision with low complexity.

FIG. 5 described above illustrates an exemplary diagram for Kalman based CE in and OFDM system, according to one embodiment. A reference signal is extracted and then descrambled. Initial channel estimation is performed based on the descrambled reference signal at the reference signal REs. A Kalman filter processes the initial channel estimation to provide an improved channel estimation at reference signal REs. Channel interpolation is performed on the reference signal REs to provide a channel estimation on data REs. The present system uses an AR model to model a time domain correlation of the channel.

After obtaining AR parameter $[A_1, \ldots, A_p]$, the system equation may be expressed in matrix form as in Equation (9) as follows:

$$H_n = CH_{n-1} + GZ_n \qquad (9)$$

where $H_n = [h_1^T, \ldots, h_p^T]$ is a kp×1 state vector consisting of a channel at reference signal locations, and $Z_n$ is a kp×1 zero mean Gaussian vector whose covariance is a kp×kp identity matrix.

For an AR system equation $h_n = \sum_{i=1}^{P} A_i h_{n-i} + B z_n$, C and G may be expressed as in Equations (10) and (11) as follows:

$$C = \begin{bmatrix} A_1 & A_2 & \cdots & A_p \\ I_k & 0_k & \cdots & 0_k \\ & \ddots & & \\ 0_k & \cdots & I_k & 0_k \end{bmatrix} \qquad (10)$$

$$G = [B, 0_k, \ldots, 0_k]^T \qquad (11)$$

where $I_k$ is an identity matrix, $0_k$ is a zero matrix, and k is an integer.

In the nth iteration, new observations are obtained as expressed in Equation (12) as follows:

$$y_n = DH_n + u_n \qquad (12)$$

where $D = [I_k, 0_k, \ldots, 0_k]$ is a k×kp observation matrix, $u_n$ is zero mean Gaussian observation noise with covariance $\sigma_u^2 I_k$.

According to one embodiment, the present system provides Kalman filter updates in each period as expressed in Equations (13)-(17) as follows:

$$M_n = C\Sigma_{n-1}C^H + GG^H, \text{ Error Covariance Prediction} \qquad (13)$$

$$\Gamma_n = DM_n D^H + \sigma_u^2 I_k, \text{ Innovation} \qquad (14)$$

$$K_n = M_n D^H \Gamma_n^{-1}, \text{ Kalman Filter Gain} \qquad (15)$$

$$x_n = Cx_{n-1} + K_n(y_n - DCx_{n-1}), \text{ State Estimate} \qquad (16)$$

$$\Sigma_n = (I - K_n D) M_n, \text{ Error Covariance Estimate} \qquad (17)$$

For n=1, an initialization may be used as expressed in Equations (18) and (19) as follows:

$$x_0 = 0_{kp} \qquad (18)$$

$$\Sigma_0 = \begin{bmatrix} R_0 & \cdots & R_{p-1} \\ \vdots & \ddots & \vdots \\ R_{p-1} & \cdots & R_0 \end{bmatrix} \qquad (19)$$

An estimated channel in each iteration may be expressed as in Equation (20) as follows:

$$\hat{H}_n = [I_k, 0_k, \ldots, 0_k] x_n \qquad (20)$$

where $x_n$ is a state estimate.

The present reduced length LS AR parameter estimation achieves significant gain over typical YW AR parameter estimation in modeling stochastic processes with long correlations.

FIG. 6 described above illustrates an exemplary flow chart of a Kalman filter based CE using LS AR parameter estimation, according to one embodiment. Compared with the Kalman filter update performed at every iteration which includes the p×p matrix inversion in Equation (15) above, the present LS AR parameter estimation is performed much less frequently. Hence, the m×m matrix inversion is negligible, as it is only computed once over many iterations.

According to one embodiment, the present apparatus and method provides reduced length LS based AR parameter estimation for fitting an AR model with known autocorrelations. The present apparatus and method may apply the reduced length LS based AR parameters to model a random process with long correlations using a small number of coefficients for complexity reduction. In one embodiment, the present system applies the reduced length LS based AR parameters to channel estimation based on a Kalman filter.

Figure 7:
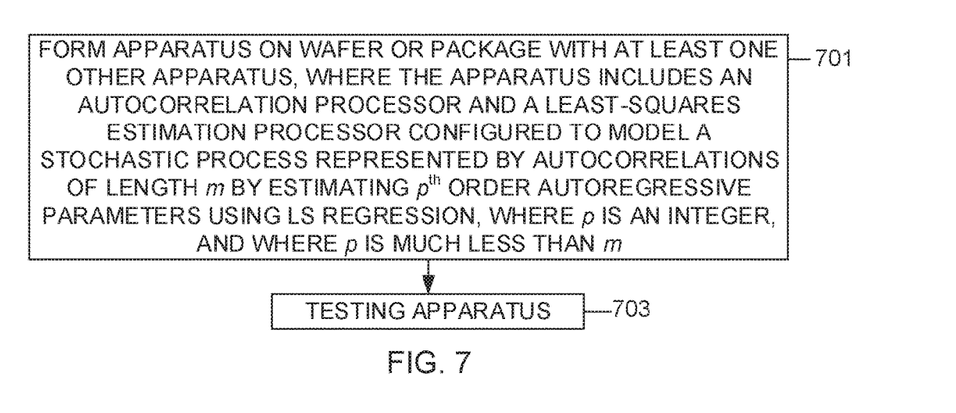
FIG. 7 illustrates an exemplary flowchart of a method of manufacturing an apparatus for modeling a random process, according to one embodiment.

FIG. 7 illustrates an exemplary flowchart of a method of manufacturing an apparatus for modeling a random process, according to one embodiment.

Referring to FIG. 7, an apparatus is formed on a wafer or a package with at least one other apparatus, where the apparatus includes an autocorrelation processor and an LS estimation processor configured to model a stochastic process represented by autocorrelations of length m by estimating $p^{th}$ order AR parameters using LS regression, where p is an integer, and where p is much less than m, at 701.

At 702, the apparatus is tested. Testing the apparatus may include testing the apparatus using one or more electrical to optical converters, one or more optical splitters that split an optical signal into two or more optical signals, and one or more optical to electrical converters.

Figure 8:
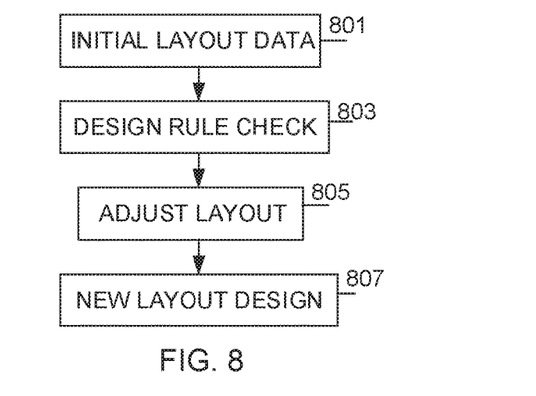
FIG. 8 illustrates an exemplary flowchart of a method of constructing an integrated circuit, according to one embodiment.

FIG. 8 illustrates an exemplary flowchart of a method of constructing an integrated circuit, according to one embodiment.

Referring to FIG. 8, initial layout data is constructed in 801. For example, a mask layout is generated for a set of features for a layer of the integrated circuit, wherein the mask layout includes standard cell library macros for one or more circuit features that include an apparatus that includes an autocorrelation processor and an LS estimation processor configured to model a stochastic process represented by autocorrelations of length m by estimating $p^{th}$ order AR parameters using LS regression, where p is an integer, and where p is much less than m, and disregarding relative positions of the macros for compliance to layout design rules during the generation of the mask layout.

At 803, a design rule check is performed. For example, the method may check the relative positions of the macros for compliance to layout design rules after generating the mask layout.

At 805, the layout is adjusted. For example, the method, upon detection of noncompliance with the layout design rules by any of the macros, may modify the mask layout by modifying each of the noncompliant macros to comply with the layout design rules.

At 807, new layout data is generated. For example, the method may generate a mask according to the modified mask layout with the set of features for the layer of the integrated circuit. Then, the integrated circuit layer according to the mask may be manufactured.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   an autocorrelation processor, configured to generate or estimate autocorrelations of length m for a stochastic process, where m is an integer; and
   a least-squares (LS) estimation processor connected to the autocorrelation processor and configured to model the stochastic process by estimating $p^{th}$ order autoregressive (AR) parameters using LS regression, where p is an integer less than m.

2. The apparatus of claim 1, further comprising a Kalman filter system parameter generation processor connected to the LS estimation processor and configured to generate system parameters for a Kalman filter including the autocorrelation processor, the LS estimation processor, and the Kalman filter system parameter generation processor, using the estimated $p^{th}$ order AR parameters.

3. The apparatus of claim 2, further comprising:
   an initial pilot-based channel estimation processor;
   the autocorrelation processor connected to the initial pilot-based channel estimation processor; and
   a channel interpolation processor connected to the Kalman filter system parameter generation processor, and configured to receive channel estimation at reference signal resource elements (REs) from the Kalman filter and perform channel interpolation on the reference signal REs to provide channel estimation on data REs.

4. The apparatus of claim 1, wherein the AR parameters are $$\begin{bmatrix} A_1 \\ \vdots \\ A_p \end{bmatrix}$$

and $BB^H$, which are calculated as follows:

$$\begin{bmatrix} A_1 \\ \vdots \\ A_p \end{bmatrix} =$$

-continued $$\left[\begin{bmatrix} R_0 & \cdots & R_{p-1} \\ \vdots & \ddots & \vdots \\ R_{m-1} & \cdots & R_{m-p} \end{bmatrix}^H \begin{bmatrix} R_0 & \cdots & R_{p-1} \\ \vdots & \ddots & \vdots \\ R_{m-1} & \cdots & R_{m-p} \end{bmatrix}\right]^{-1} \begin{bmatrix} R_0 & \cdots & R_{p-1} \\ \vdots & \ddots & \vdots \\ R_{m-1} & \cdots & R_{m-p} \end{bmatrix}^H \begin{bmatrix} R_1 \\ \vdots \\ R_m \end{bmatrix}$$

$$BB^H = R_0 - [A_1, \ldots, A_p] \begin{bmatrix} R_0 & \cdots & R_{p-1} \\ \vdots & \ddots & \vdots \\ R_{p-1} & \cdots & R_0 \end{bmatrix} \begin{bmatrix} A_1 \\ \vdots \\ A_p \end{bmatrix}$$

wherein $R_i$ is an autocorrelation, and i is an integer.

5. The apparatus of claim 2, wherein the system parameters for the Kalman filter comprise C and G as follows:

$$C = \begin{bmatrix} A_1 & A_2 & \cdots & A_p \\ I_k & 0_k & \cdots & 0_k \\ & & \ddots & \\ 0_k & \cdots & I_k & 0_k \end{bmatrix}$$

$$G = [B, 0_k, \ldots, 0_k]^T$$

wherein $A_i$ and B are the AR parameters, $I_k$ is an identity matrix, $0_k$ is a zero matrix, and i and k are integers.

6. The apparatus of claim 3, wherein the Kalman filter is further configured, at an $n^{th}$ iteration, to update an error covariance prediction, an innovation, a Kalman gain, a state estimate, and an error covariance estimate, where n is an integer.

7. The apparatus of claim 3, wherein the channel interpolation processor is further configured to perform channel estimation $\hat{H}_n$ in each iteration as follows:

$$\hat{H}_n = [I_k, 0_k, \ldots, 0_k] x_n$$

wherein $I_k$ is an identity matrix, $0_k$ is a zero matrix, and $x_n$ is a state estimate.

8. The apparatus of claim 3, wherein the Kalman filter is further configured to receive a channel observation $Y_n$ and noise variance $\sigma_u^2$, where n and u are integers.

9. The apparatus of claim 3, wherein the Kalman filter is further configured to be initialized by $x_0$ and $\Sigma_0$ as follows:

$$x_0 = 0_{kp}$$

$$\Sigma_0 = \begin{bmatrix} R_0 & \cdots & R_{p-1} \\ \vdots & \ddots & \vdots \\ R_{p-1} & \cdots & R_0 \end{bmatrix}$$

wherein $\Sigma_0$ is a matrix of autocorrelation sequences $R_i$, and k, p, and i are integers.

10. A method, comprising:
generating or estimating, by an autocorrelation processor, autocorrelations of length m for a stochastic process, where m is an integer; and
modelling the stochastic process, by a least-squares (LS) estimation processor, by estimating $p^{th}$ order autoregressive (AR) parameters using LS regression, where p is an integer much less than m.

11. The method of claim 10, further comprising generating, by a Kalman filter system parameter generation processor connected to the LS estimation processor, system parameters for a Kalman filter including the autocorrelation processor, the LS estimation processor, and the Kalman filter system parameter generation processor, using the estimated $p^{th}$ order AR parameters.

12. The method of claim 11, further comprising:
initializing the Kalman filter;
receiving, by the Kalman filter, channel observations $Y_n$ and noise variance $\sigma_u^2$;
updating an $n^{th}$ iteration of the Kalman filter; and
determining channel estimation for each iteration.

13. The method of claim 10, wherein the AR parameters are $$\begin{bmatrix} A_1 \\ \vdots \\ A_p \end{bmatrix}$$

and $BB^H$, which are calculated as follows:

$$\begin{bmatrix} A_1 \\ \vdots \\ A_p \end{bmatrix} =$$

$$\left[\begin{bmatrix} R_0 & \cdots & R_{p-1} \\ \vdots & \ddots & \vdots \\ R_{m-1} & \cdots & R_{m-p} \end{bmatrix}^H \begin{bmatrix} R_0 & \cdots & R_{p-1} \\ \vdots & \ddots & \vdots \\ R_{m-1} & \cdots & R_{m-p} \end{bmatrix}\right]^{-1} \begin{bmatrix} R_0 & \cdots & R_{p-1} \\ \vdots & \ddots & \vdots \\ R_{m-1} & \cdots & R_{m-p} \end{bmatrix}^H \begin{bmatrix} R_1 \\ \vdots \\ R_m \end{bmatrix}$$

$$BB^H = R_0 - [A_1, \ldots, A_p] \begin{bmatrix} R_0 & \cdots & R_{p-1} \\ \vdots & \ddots & \vdots \\ R_{p-1} & \cdots & R_0 \end{bmatrix} \begin{bmatrix} A_1 \\ \vdots \\ A_p \end{bmatrix}$$

wherein $R_i$ is an autocorrelation, and i is an integer.

14. The method of claim 11, wherein the system parameters for the Kalman filter comprise C and G as follows:

$$C = \begin{bmatrix} A_1 & A_2 & \cdots & A_p \\ I_k & 0_k & \cdots & 0_k \\ & & \ddots & \\ 0_k & \cdots & I_k & 0_k \end{bmatrix}$$

$$G = [B, 0_k, \ldots, 0_k]^T$$

wherein $A_i$ and B are the AR parameters, $I_k$ is an identity matrix, $0_k$ is a zero matrix, and i and k are integers.

15. The method of claim 12, wherein updating the $n^{th}$ iteration of the Kalman filter comprises updating an error covariance prediction, an innovation, a Kalman gain, a state estimate, and an error covariance estimate, where n is an integer.

16. The method of claim 12, wherein determining the channel estimation further comprises performing channel estimation $\hat{H}_n$ in each iteration as follows:

$$\hat{H}_n = [I_k, 0_k, \ldots, 0_k] x_n$$

wherein $I_k$ is an identity matrix, $0_k$ is a zero matrix, and $x_n$ is a state estimate.

17. The method of claim 12, wherein updating the $n^{th}$ iteration of the Kalman filter further comprises forming an observation matrix by an identity matrix and zero matrices.

18. The method of claim 12, wherein the Kalman filter is further configured to be initialized by $x_0$ and $\Sigma_0$ as follows:

$$x_0 = 0_{kp}$$

$$\Sigma_0 = \begin{bmatrix} R_0 & \cdots & R_{p-1} \\ \vdots & \ddots & \vdots \\ R_{p-1} & \cdots & R_0 \end{bmatrix}$$

wherein $\Sigma_0$ is a matrix of autocorrelation sequences $R_i$, and k, p, and i are integers.

19. A method of manufacturing an apparatus, comprising:

forming the apparatus on a wafer or a package with at least one other apparatus, wherein the apparatus comprises an autocorrelation processor and an least-squares (LS) estimation processor configured to model a stochastic process represented by autocorrelations of length m by estimating $p^{th}$ order autoregressive parameters using LS regression; and testing the apparatus, wherein testing the coarse timing and frequency synchronization apparatus comprises testing the apparatus using one or more electrical to optical converters, one or more optical splitters that split an optical signal into two or more optical signals, and one or more optical to electrical converters.

20. A method of constructing an integrated circuit, comprising:

generating a mask layout for a set of features for a layer of the integrated circuit, wherein the mask layout includes standard cell library macros for one or more circuit features that include an apparatus comprising an autocorrelation processor and a least-squares (LS) estimation processor configured to model a stochastic process represented by autocorrelations of length m by estimating $p^{th}$ order autoregressive parameters using LS regression, where p is an integer, and where p is much less than m;

disregarding relative positions of the macros for compliance to layout design rules during the generation of the mask layout;

checking the relative positions of the macros for compliance to layout design rules after generating the mask layout;

upon detection of noncompliance with the layout design rules by any of the macros, modifying the mask layout by modifying each of the noncompliant macros to comply with the layout design rules;

generating a mask according to the modified mask layout with the set of features for the layer of the integrated circuit; and manufacturing the integrated circuit layer according to the mask.

* * * * *